United States Patent
Scollay (10) Patent No.: US 8,382,965 B2
(45) Date of Patent: Feb. 26, 2013

(54) TOOLS AND METHODS FOR MOUNTING TRANSPORT RAILS IN A SUBSTRATE PROCESSING SYSTEM

(75) Inventor: Stuart Scollay, San Jose, CA (US)

(73) Assignee: Intevac, Inc., Santa Clara, CA (US)

( * ) Notice: Subject to any disclaimer, the term of this patent is extended or adjusted under 35 U.S.C. 154(b) by 828 days.

(21) Appl. No.: 12/263,369

(22) Filed: Oct. 31, 2008

(65) Prior Publication Data

US 2009/0279990 A1    Nov. 12, 2009

Related U.S. Application Data (60) Provisional application No. 61/052,144, filed on May 9, 2008.

(51) Int. Cl.
*C23C 14/00* (2006.01)
*C25B 11/00* (2006.01)
*C25B 13/00* (2006.01)

(52) U.S. Cl. ................. 204/298.15; 414/222.01

(58) Field of Classification Search ............ 204/298.15; 414/222.01
See application file for complete search history.

(56) References Cited

U.S. PATENT DOCUMENTS

| | | | | |
|---|---|---|---|---|
| 5,417,537 | A * | 5/1995 | Miller | 414/217 |
| 6,349,435 | B1 * | 2/2002 | Mitchell | 5/296 |
| 6,919,001 | B2 | 7/2005 | Fairbairn et al. | |
| 2005/0217027 | A1 * | 10/2005 | Polevoy et al. | 5/201 |

* cited by examiner

*Primary Examiner* — Keith Hendricks
*Assistant Examiner* — Ibrahime A Abraham
(74) *Attorney, Agent, or Firm* — Nixon Peabody LLP; Joseph Bach, Esq.

(57) ABSTRACT

Devices and methods for mounting and aligning transport rails to a processing chamber of a substrate processing system are described. An alignment feature is built-in to the transport rail and a corresponding alignment feature is added to the valves separating processing chambers. The alignment feature may be a pin-groove arrangement.

17 Claims, 12 Drawing Sheets

TOOLS AND METHODS FOR MOUNTING TRANSPORT RAILS IN A SUBSTRATE PROCESSING SYSTEM

CROSS REFERENCE TO RELATED APPLICATIONS

This application claims the benefit of U.S. Provisional Application No. 61/052,144, filed May 9, 2008, entitled "METHOD OF MOUNTING RAILS FOR CARRIER TRANSPORT IN VACUUM SYSTEM," the entirety of which is hereby incorporated by reference.

BACKGROUND

1. Field

The subject invention relates to semiconductor processing tools and, in particular, to tools and methods for mounting transport rails in a vacuum processing tool.

2. Related Art

Substrate processing tools are used to make disks, computer chips, solar panels, and the like, from semiconductor wafers or similar substrates. Typically, the substrate processing tools includes several substrate chambers that perform various processes that modify the substrate, such as, deposition, cleaning, heat/cool, etc. In disk processing systems, the disks are transported in the substrate processing tool by a carrier riding on transport rails that form a drive track.

In current substrate processing tools, the transport rails are mounted to the chamber walls or the motor housing of the transport mechanism. Fasteners secure the transport rails via an angle bracket. This mounting configuration is both time consuming to install and is difficult to maintain. For example, during operation of the tool, the repetitive movements of the carrier sometimes cause the fasteners to loosen or even become lost, requiring either tightening or replacement of the fasteners.

In addition, alignment of the transport rails is necessary for smooth transport of the wafers. Alignment with the bracket and fastener configuration is challenging because of a tolerance stack-up in the parts, which can cause the rail to be out of alignment in one axis (i.e., not perpendicular to the system). In order to align the transport rails with one another, tools such as clamps or laser sights are often required to align each of the individual rails with the next station. Slot valves (or other isolation valves) that separate the chambers can also interfere with the alignment.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, tools and methods for aligning transport rails in a substrate processing system are described. The rails are mounted by machining pin holes, inserting pins into each of the pin holes, and engaging slots in the rails with the pins. The pins are positioned at the same locations on each seat, automatically aligning the rails when the slots are fully engaged with the pins. This configuration eliminates the need for the cumbersome alignment tools, and makes installation, maintenance and replacement of the rails much simpler.

According to an aspect of the invention, a substrate processing system is provided that includes a processing chamber having a first side and a second opposing side; a first valve housing on the first side; a second valve housing on the second opposing side; a first pin connected to the first valve housing at a first location; a second pin connected to the second valve housing at a second location, the first location being horizontally aligned to the second location; and a rail having a slot corresponding to first pin and second pin, the slot engageable with the first pin and the second pin to mount the rail to the first valve housing and the second valve housing.

The rail may traverse the interior of the chamber in a suspended manner.

The slot may include a first slot portion and a second slot portion connected to the first slot portion, the second slot portion having a slot tip, and the slot tip may contact the first pin and the second pin when the rail is mounted to the processing chamber.

The rail may include a first slot corresponding to the first pin and a second slot corresponding to the second pin, the first slot engageable with the first pin and the second slot engageable with the second pin.

The first valve housing may include a first location pin hole and the second valve housing includes a second location pin hole, the first pin insertable into the first location pin hole and the second pin insertable into the second location pin hole.

The substrate processing system may also include a second processing chamber having a first side and a second opposing side; a third valve housing on the second opposing side of the second processing chamber; a third pin connected to the second valve housing at a third location; a fourth pin connected to the third valve housing at a fourth location, the third location and the fourth location being linearly aligned with the first location and the second location; a second rail having a slot corresponding to third pin and fourth pin, the slot engageable with the third pin and the fourth pin to mount the second rail to the second valve housing and the third valve housing.

The first rail and the second rail may be linearly aligned.

The first rail and the second rail may be mounted such that a gap is provided between the first rail and the second rail.

The substrate processing system may also include an elevator chamber having a first side and a second opposing side and a movable elevator structure; a second rail mounted to the movable elevator structure; a second processing chamber having a first side and a second opposing side; an adapter housing between the elevator chamber and the second processing chamber; a third pin connected to the second valve housing at a third location, the third location being horizontally aligned to the first location and the second location; a third rail having a slot corresponding to third pin, the slot engageable with the third pin; and an extension bracket having a fourth pin, the extension bracket mounted to the adapter, the slot of the third rail engageable with the fourth pin to suspend the third rail within the second processing chamber.

According to another aspect of the invention, a substrate processing system is provided that includes a transport chamber; a plurality of processing chambers connected to the transport chamber; a plurality of valves, each of the plurality valves separating one of the processing chambers from an adjacent one of the processing chambers, each of the plurality valves having a valve housing, and each valve housing having a first pin and a second pin symmetrically opposing the first pin; a plurality of rails, each rail mountable on the first pin on one of the plurality of valve housings and a second pin on another of the plurality of valve housings so as to be suspend within one of the processing chambers; and a transport mechanism movable on the plurality of rails to transport a substrate among the plurality of processing chambers.

The substrate processing system may also include an elevator chamber having a movable elevator structure, the elevator chamber connected to two of the plurality of processing chambers; a first adapter and a second adapter between each of the two processing chambers and the elevator chamber; a transport rail mounted to the movable elevator structure; first and second extension brackets to connect the transport rails of the two processing chambers to the first adapter and second adapter.

Each of the rails may include a slot engageable with the first pin of one value housing and the second pin of another valve housing.

The slot may include a first slot portion and a second slot portion connected to the first slot portion, the second slot portion having a slot tip, and wherein the at least one slot may include a first slot engageable with the first pin and a second slot engageable with the second pin.

The valve may include a first locating pin hole and a second locating pin hole, the first pin insertable into the first locating pin hole and the second pin insertable into the second locating pin hole.

The plurality of rails may be linearly aligned with one another to form a continuous linear rail. The continuous linear rail may include gaps between adjacent ones of the plurality of rails.

According to another aspect of the invention, a method for aligning rails in a substrate processing system is provided that includes forming a first pin hole in a first valve housing at a first location; forming a second pin hole in a second valve housing at a second location, wherein the first location is symmetrically aligned with the second location; mounting a first pin in the first pin hole; mounting a second pin in the second pin hole; forming a slot in a rail; and engaging the slot of the rails with the first and second pins to mount the rail to the first and second valves in the substrate processing system.

Forming a slot in a rail may include forming a first slot in the rail and forming a second slot in the rail, and wherein engaging the slot with the first pin and second pin may include engaging the first slot with the first pin and engaging the second slot with the second pin.

The method may also include forming a third pin hole in the first valve at a third location; forming a fourth pin hole in a second valve at a fourth location, wherein the third location is symmetrically aligned with the fourth location; mounting a third pin in the third pin hole; mounting a fourth pin in the fourth pin hole; forming a slot in a second rail; and engaging the slot of the second rail with the third pin and fourth pin.

Forming a slot in the second rail may include forming a third slot and a fourth slot, and wherein engaging the slot of the second rail with the third pin and fourth pin may include engaging the third slot with the third pin and engaging the fourth slot with the fourth pin.

Forming a slot in the rail may include forming a first slot portion and a second slot portion connected to the first slot portion, the second slot portion having a slot tip.

Engaging the slot of the rails with first and second pins may include inserting the first and second pins into the first slot portion; and sliding the first and second pins in the second slot portion until the first and second pins contact the slot tip.

According to another aspect of the invention, a method for fabricating a substrate processing system having aligned rails is provided that includes forming a first pin hole in each of a plurality of valve housings at a first location; forming a second pin hole in each of the plurality of valve housings at a second location, wherein the first location is symmetrically aligned with the second location; mounting a first pin in the first pin hole; mounting a second pin in the second pin hole; coupling the plurality of valve housings to a plurality of chambers, such that one valve housing is situated between each two chambers; forming slots in rails; and engaging one slot of each rail with the first pin of one valve housing and an opposing slot with the second pin of an opposing valve housing so as to mount the rail to be suspended within a chamber.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Embodiments of the invention relate to an improved mounting configuration for the transport rails. According to embodiments of the invention, the transport rails are mounted to the housing of isolation valves that are adjacent each processing chamber. Pin holes are machined in both sides of the valve housing, and pins are inserted into those pin holes. The transport rails have slots that are engageable with the pins. The transport rails are, thus, mounted to the valve housing via the pin-and-slot arrangement. Because all of the pins are positioned at the same location on each valve housing, the transport rails are automatically aligned. The mounting configuration, therefore, eliminates the need for the cumbersome alignment tools, and makes installation, maintenance and replacement of the rails much simpler.

Figure 1:
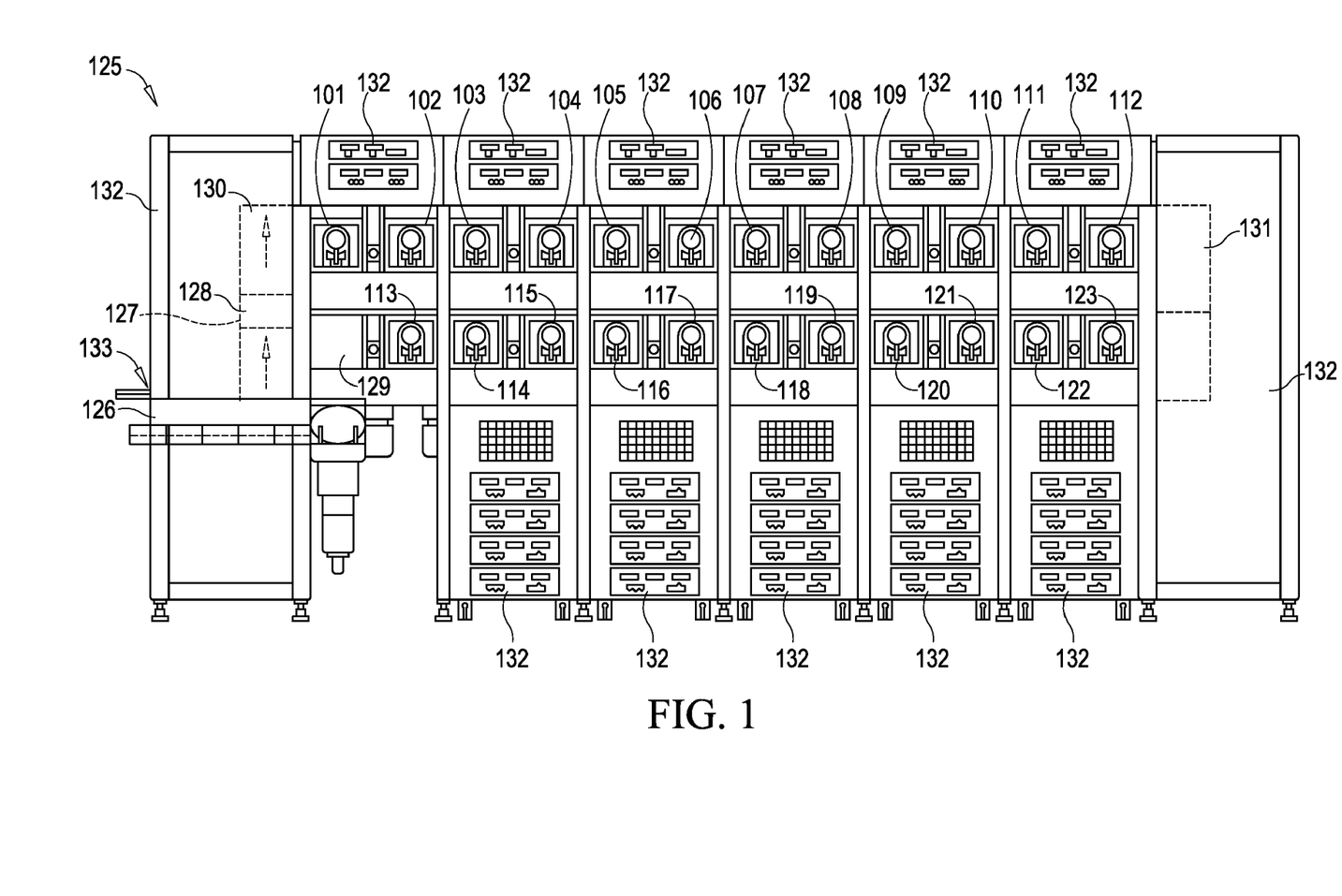
FIG. 1 is a perspective view of a substrate processing system in accordance with one embodiment of the invention.

An embodiment of the invention will now be described in detail with reference to FIG. 1. FIG. 1 illustrates a substrate processing system 125. It will be appreciated that the configuration shown in FIG. 1 is merely exemplary. The substrate processing system 125 may have additional or fewer components, and the arrangement of the components may vary, as known to those of skill in the art.

As shown in FIG. 1, the substrate processing system 125 includes a number of process stations in a stacked relationship, in which a second layer of process stations is positioned on top of a base layer of process stations. In FIG. 1, the system 125 includes twenty-three processing stations 101-123. It will be appreciated that the number of stations can be less than or greater than twenty-three.

To load the system 125, a cassette of substrates is fed into a load/unload aperture 126. The cassette travels along a path into position at a load/unload station 129. A disk carrier (see FIG. 3B) moves into the load/unload chamber 129 where a transfer mechanism transfers the disk to the disk carrier. The disk carrier then moves to an elevator 128 and is lifted to a level adjacent to the upper set of process stations and directly adjacent to station 101. The substrate and carrier then move as a unit and transfer into station 101 where processing of the disk is started. Thereafter, the combined unit of a substrate and a disk carrier, move into the adjacent processing station 102. After processing at station 102, the combined unit moves on to the adjacent station 103 where the disk is carried through additional processing operations. The combined unit travels from one processing chamber to the next along the upper level in series from 101 to 112 and to the elevator 131. The combined unit is then lowered to the lower level and travels from station 123 back to station 113, in which the disk undergoes additional processing.

Figure 2A:
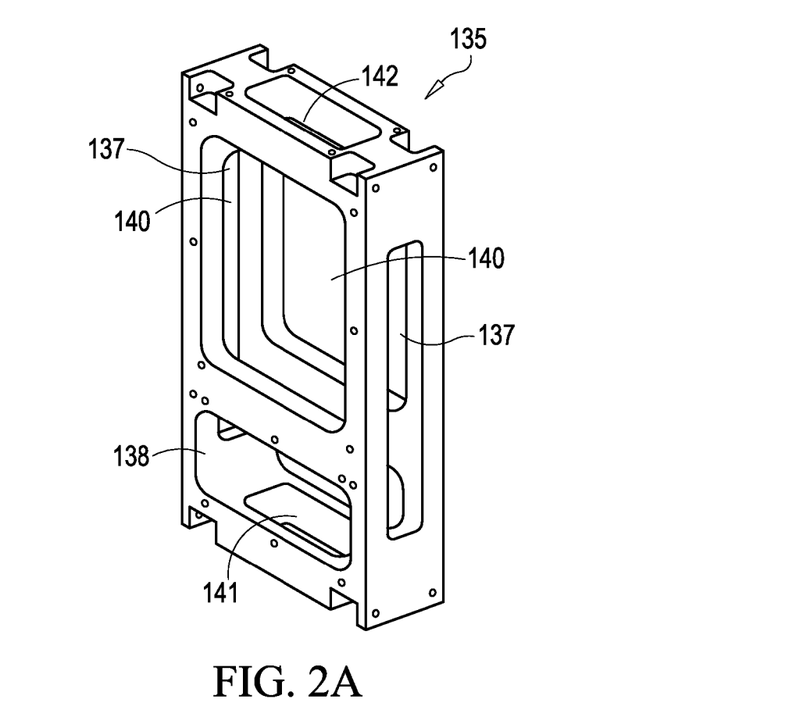
FIGS. 2A-2B are detailed schematic views of the substrate processing station and transport mechanism in accordance with one embodiment of the invention.

FIG. 2A shows the structure of a typical process chamber 135. The process chamber 135 includes a housing 136 having openings 137, 138, 140, 141 and 142. Isolation seals are positioned at the openings 137 to isolate the chamber 135 from adjacent chambers and the rest of the system 125. A cold trap, vacuum pump or instrumentation may be placed at the top opening 142. The primary vacuum pump is positioned adjacent to the chamber on the isolation valve housing and pumps through opening 137. Each process chamber 135 may have its own cryo, turbo or other suitable pump to maintain uniform and controlled vacuum environments in each of the chambers. The front and back openings 140 are used, for example, in connection with a chamber doing sputter deposition, to position sources with targets on each side of the substrate being coated or processed. It will be appreciated that other processing devices may also be positioned at these openings 140. Components of the transport mechanism are positioned at the openings 138 and 141.

Figure 2B:
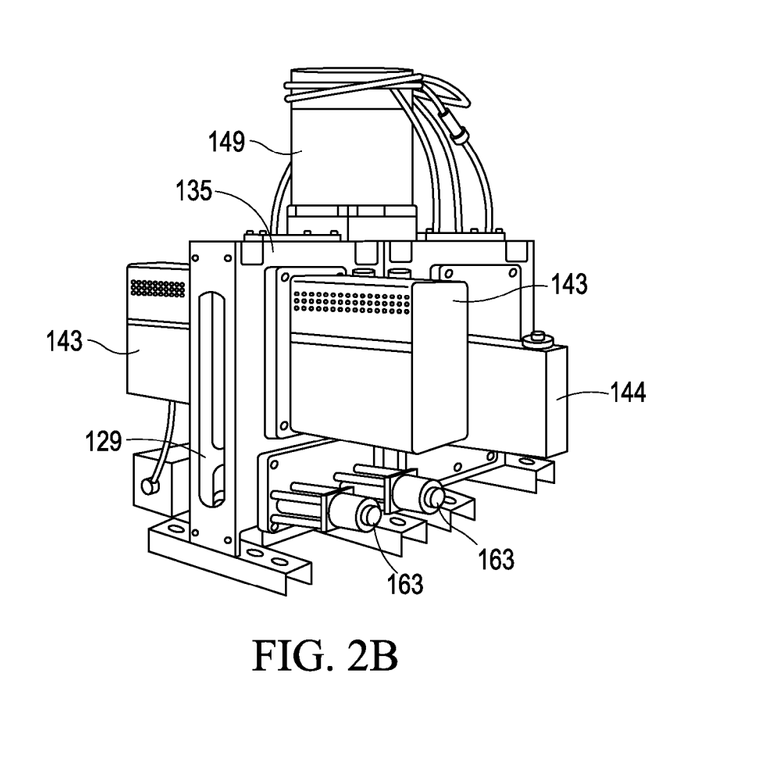

FIG. 2B illustrates a processing station with the pump, sputtering sources and an isolation valve positioned at the openings 137-142. In particular, the turbo pump 149 is positioned at the opening 142, and two sputtering sources 143 are positioned at openings 140. An isolation valve 144 is positioned at the opening 137. It will be appreciated that when the chamber 135 is assembled with other chambers 135, an elevator or another chamber having an isolation valve will be positioned at the opening 137.

Figure 3A:
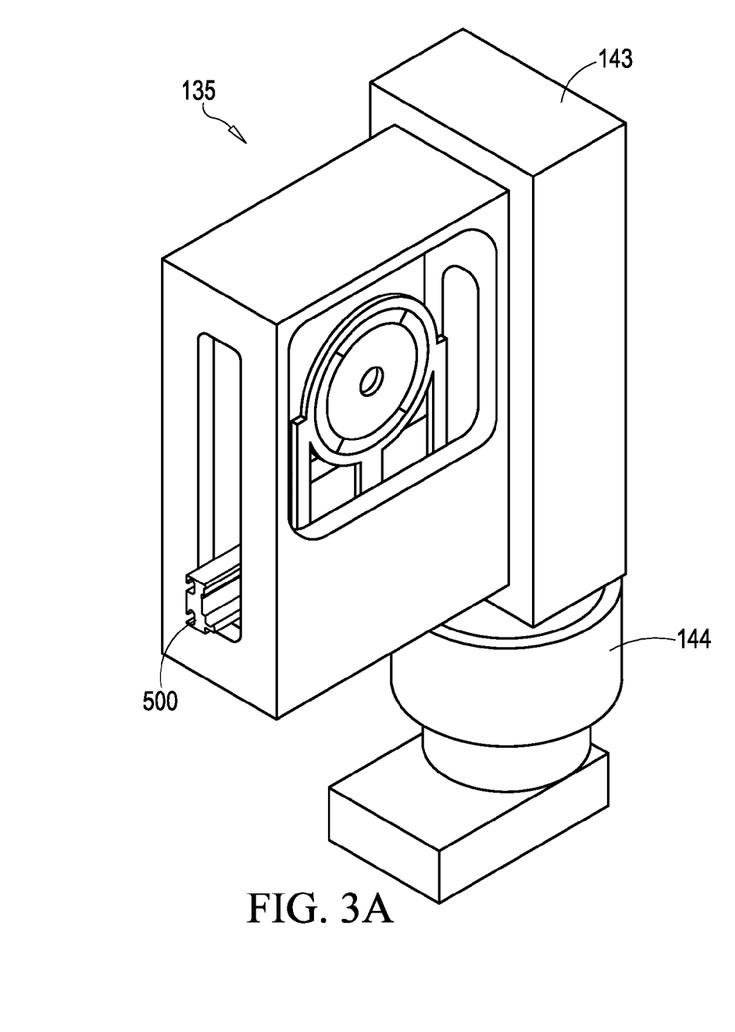
FIG. 3A-3B are schematic views of the substrate processing station and transport mechanism in accordance with one embodiment of the invention.

FIG. 3A illustrates the process chamber 135 showing the isolation valve 143 and vacuum pump 144 in further detail.

Figure 3B:
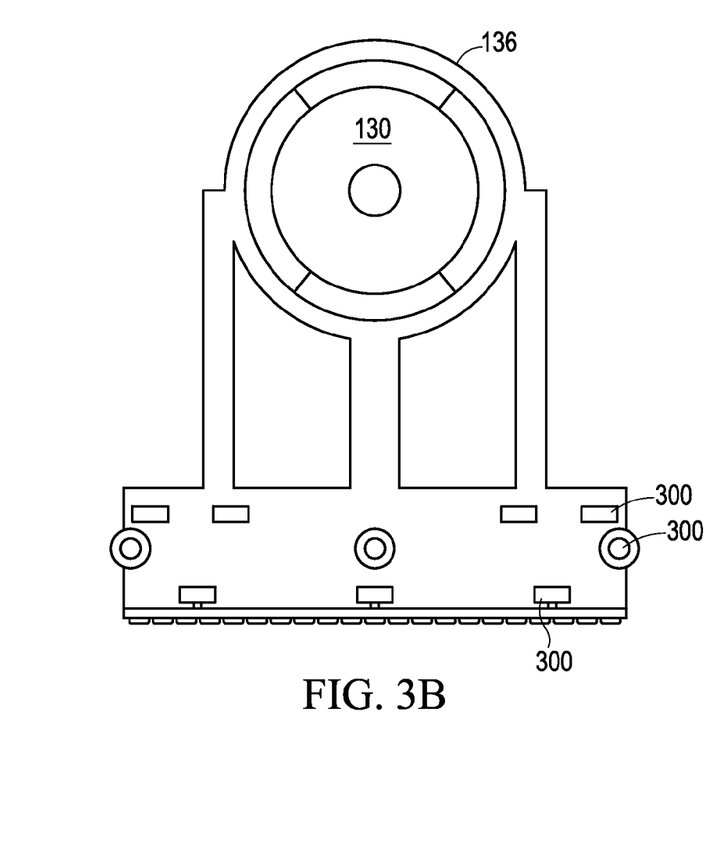

The isolation valve 143 operates to close and open opening 137 of the chamber 135. FIG. 3B shows the disk carrier 136 with a substrate 130 in further detail. In FIG. 3A, the disk carrier 136 is also shown in the process chamber 135. The substrate 130 is positioned into the disk carrier 136 and held in place in the disk carrier 136 throughout its travels, and is released following processing in the various processing chambers by the transfer mechanism that grips the disk by its inner hole and a gripper actuator and a gripper actuator mechanism that opens the carrier jaws after the disk is gripped for unloading or before the disk is ungripped for loading. As shown in FIG. 3A, the process chamber 135 also includes a transport rail 500. The carrier 136 includes wheels 300 that engage with the transport rail 500 for transporting the substrate 130 within the substrate processing system 125.

Figure 4:
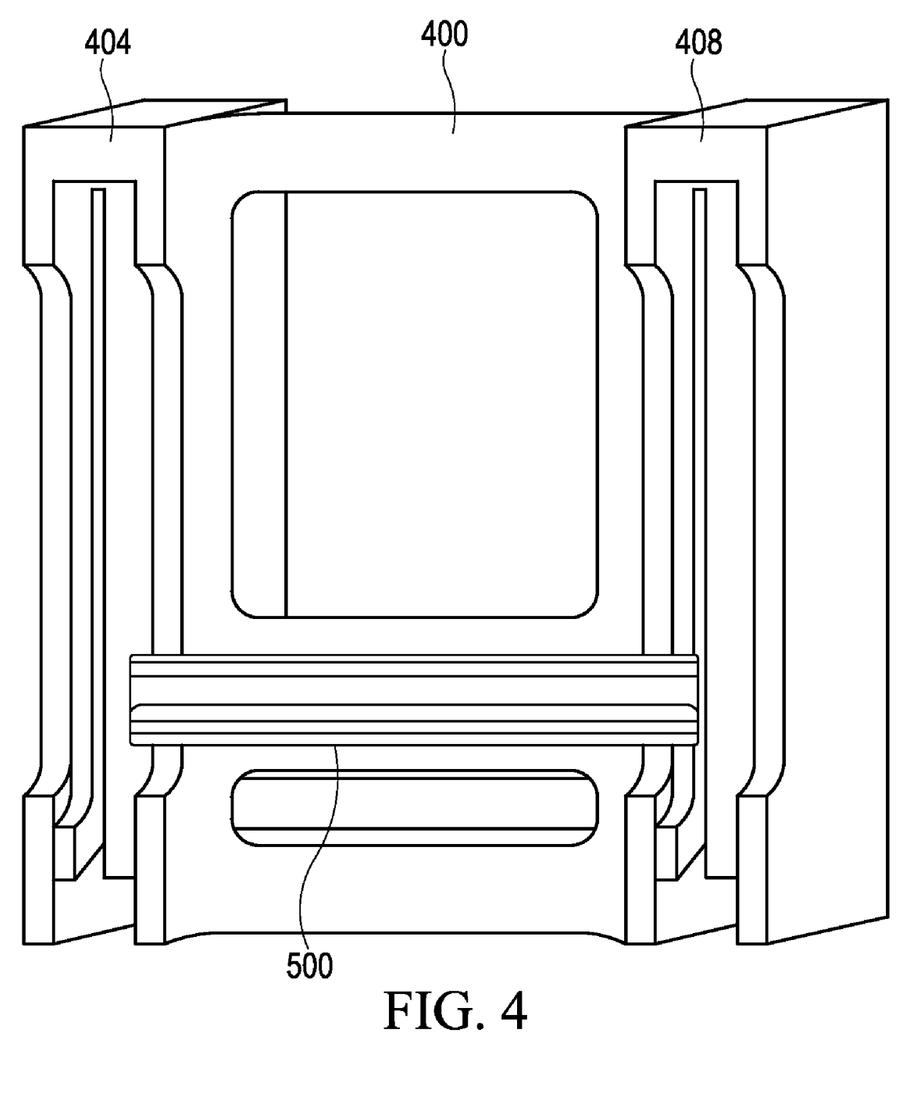
FIG. 4 is a detailed perspective view of a processing chamber and a transport rail in accordance with one embodiment of the invention.

FIGS. 4-7 illustrate a mounting configuration for transport rails according to embodiments of the invention. FIG. 4 is a cross-sectional view of the process chamber 135 (shown in FIG. 3A) with an isolation valve 143 on each side of the process chamber 135. In particular, in FIG. 4, a first valve housing 404 is shown positioned on one side of the processing chamber 400 and a second valve housing 408 is positioned on an opposing side of the processing chamber 400. The rail 500 is mounted to the first valve 404 and the second valve 408 using a pin-in-groove arrangement, and, in this embodiment, traverses the chamber 400 without being attached to the chamber 400.

Figure 5:
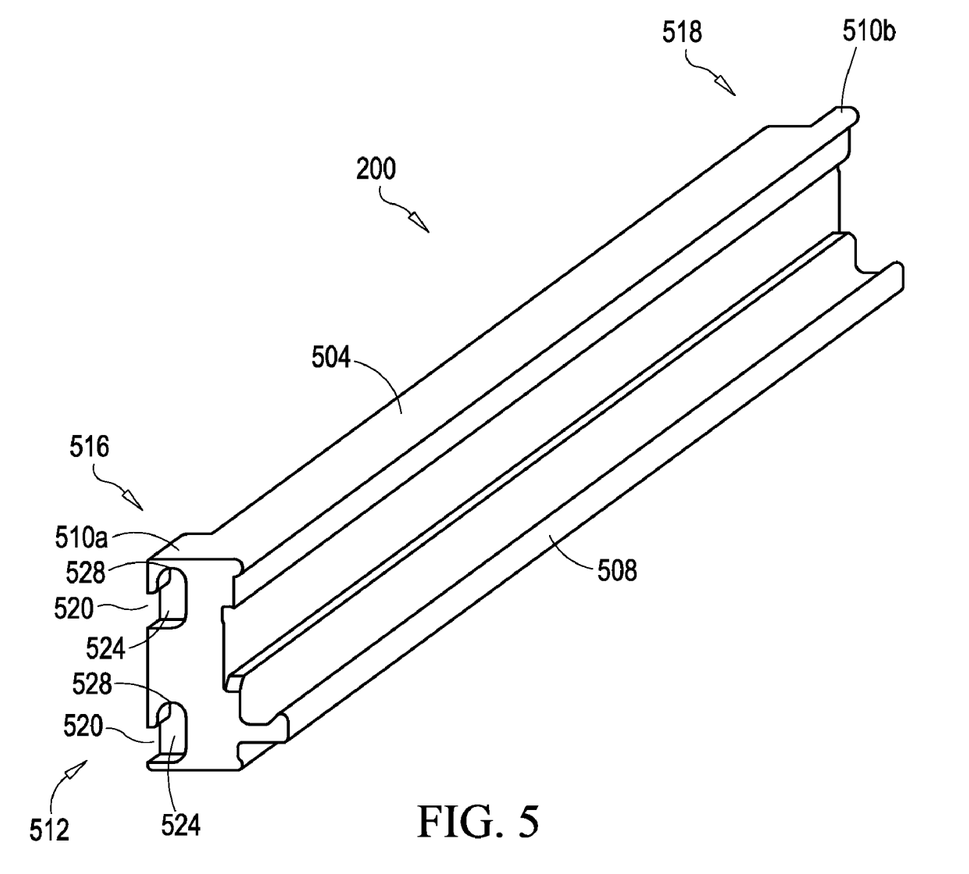
FIG. 5 is a detailed perspective view of a transport rail in accordance with one embodiment of the invention.

As shown in FIG. 5, the rail 500 includes an elongate body 504 that has a lip 508 extending therefrom. The wheels rest on a top surface of the lip 508 and are configured to move linearly on the lip 508. In FIG. 5, the elongate body 504 includes two extensions: a first extension 510a and a second extension 510b. With reference to FIGS. 4 and 5 in combination, the first extension 510a is configured to abut the first valve housing 404 while the second extension 510b is configured to extend in front of a portion of the second valve housing 408. Thus, the length of the elongate body 504 is at least the width of the processing chamber 400 and a portion of the width of at least one of the valve housings 404, 408. It will be appreciated that the length of the elongate body 504 should be small enough that the rail 500 does not interfere with operation of the isolation valve.

Referring back to FIG. 5, the elongate body 504 includes two openings 512 at the end 516 of the rail 500. In particular, the openings 512 at the end 516 are located on the first extension 510a of the of the elongate body 504. The same two openings 512 are also provided at the other end 518 of the elongate body 504 on the elongate body itself (i.e., not on the extension 510b).

It will be appreciated that the elongate body 504 can have a different configuration than illustrated in FIG. 5. For example, the extensions 510a, 510b can both extend in front of the valve housings 404, 408 (e.g., extension 510a extends about half the width of valve housing 404 and extension 510b extends about half the width of valve housing 408). In such a configuration, the openings 512 would be located at the ends 516, 518 of the elongate body 504.

It will be appreciated that two elongate openings may extend from end 516 to the other end 518 of the elongate body 504 (e.g., two continuous slots), or that independent sets of openings 512 may be provided at each end 516, 518 of the elongate body 508. The openings 512 are configured to engage with pins provided on the valve housings 404, 408.

Each opening 512 includes a first slot portion 520 and a second slot portion 524 connected to the first slot. The second slot portion 524 includes a slot tip 528. In FIG. 5, the first slot portion 520 and the second slot portion 524 are substantially perpendicular to one another. It will be appreciated, however, that the opening 512 may have a different configuration. For example, the slot portions 520, 524 may be an angle relative to one another (e.g., 120°, 60°, 85°, etc.). In another example, one or more of the slot portions 520, 524 may be curved. In addition, the length of each slot portion 520, 524 may be different. For example, the first slot portion 520 may be very short while the second slot portion 524 is long or vice versa. In addition, additional slot portions may be provided. For example, third and fourth slot portions may be provided to form a serpentine-shaped opening.

Figure 6A:
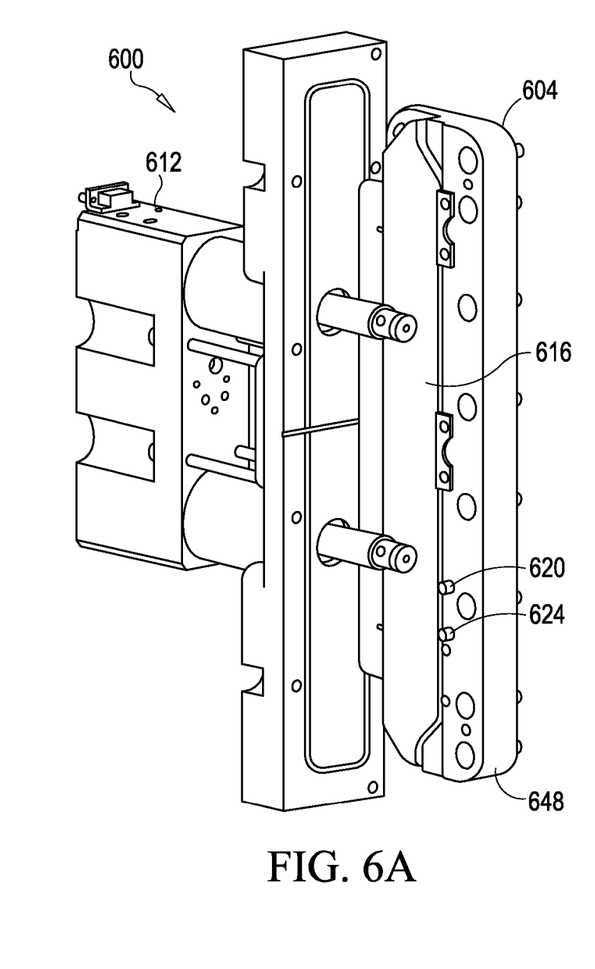
FIGS. 6A and 6B are detailed perspective views of a valve illustrating placement of locating pins on the valve in accordance with one embodiment of the invention.
Figure 6B:
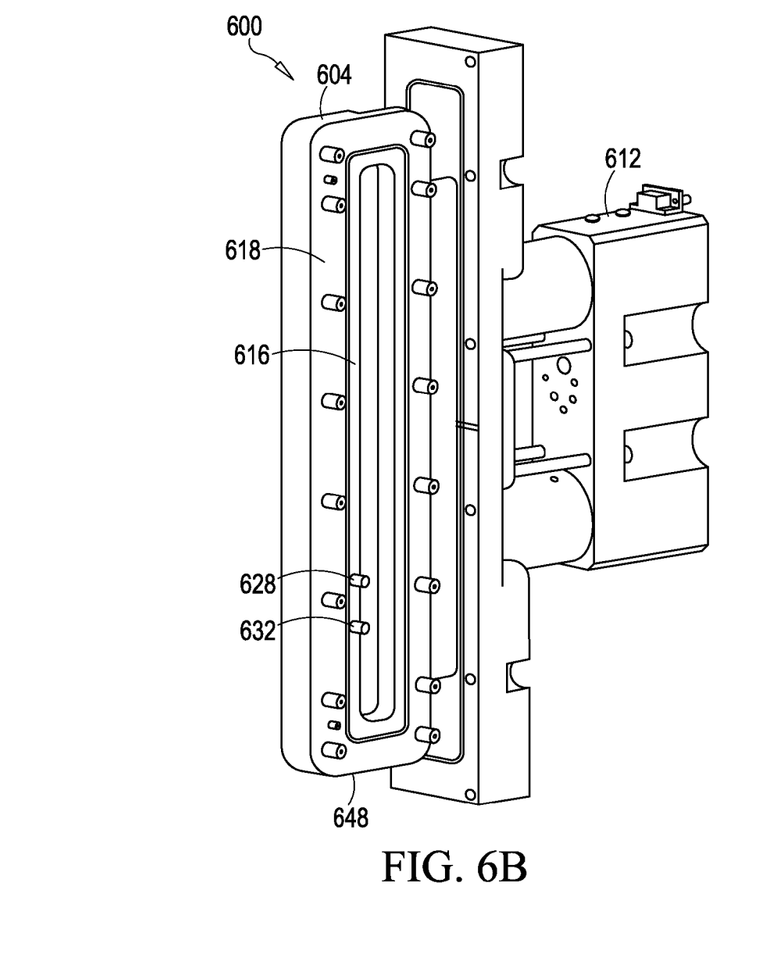

FIGS. 6A and 6B illustrate the valve assembly 600 corresponding to the valve housings 404, 408 in further detail. FIG. 6A shows the valve assembly 600 from a front perspective view, while FIG. 6B shows the valve assembly 600 from the rear perspective view. The valve assembly 600 includes a valve seat 604, a valve opening 608, a pump 612, and a valve blade 616 configured to cover the valve opening 608.

Four pins 620, 624, 628 and 632 are positioned on the valve seat 604. Two pins 620, 624 are on a front side 640 and two pins 628, 632 are on a rear side 644 of the valve seat 604. The pins 620, 624 are in line with one another and the pins 628, 632 are in line with one another. The pins 620, 628 are located at the same height relative to a bottom surface 648 of the valve seat 604 (i.e., a first height), and the pins 624, 632 are also located at the same height relative to the bottom surface 648 of the valve seat 604 (i.e., a second height). The height of the pins 620, 628 is higher than the height of the pins 624, 632 (i.e., the first height is smaller than the second height).

Figure 7:
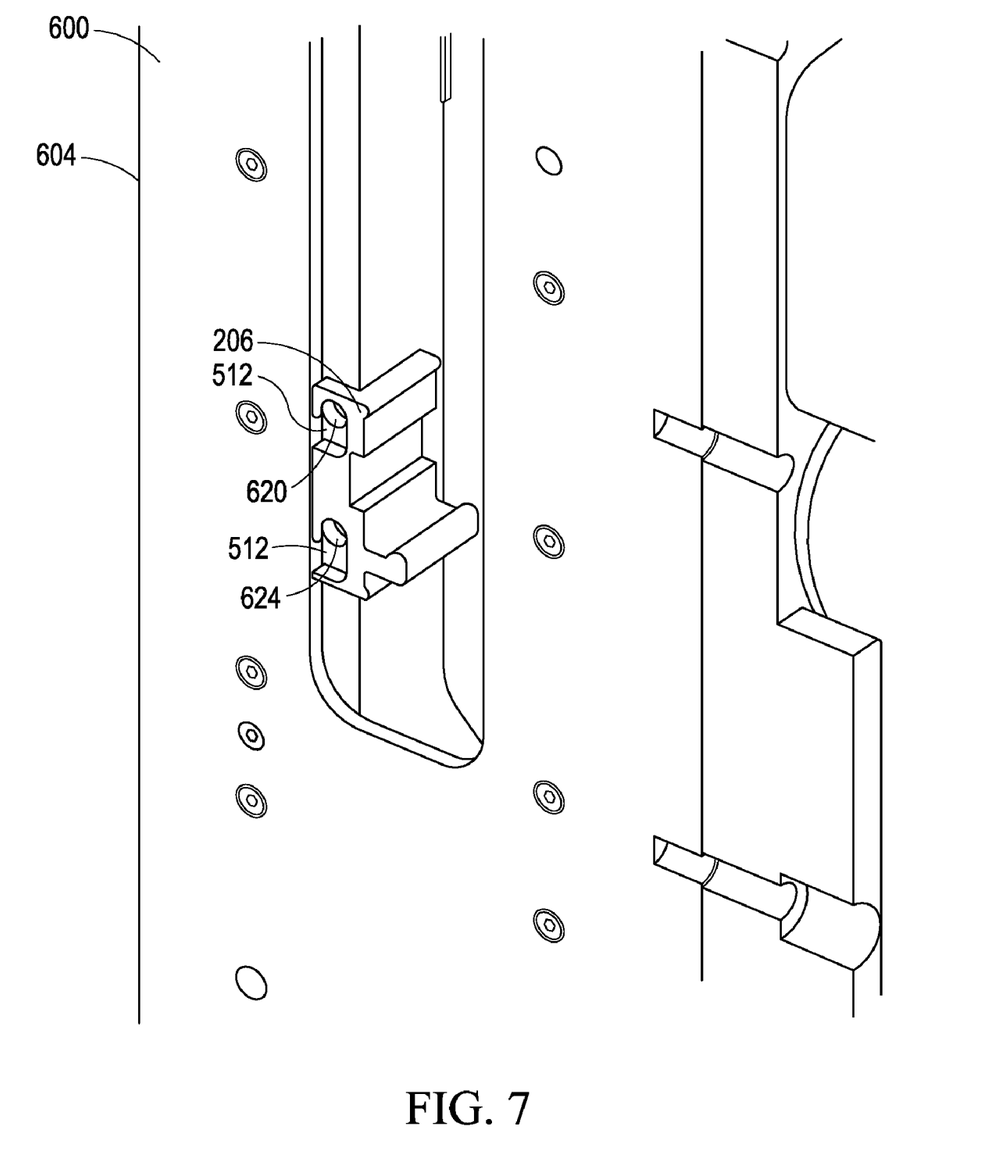
FIG. 7 is a cross-sectional view illustrating connection of the transport rail and valve.

With reference to FIGS. 4-7 in combination, the openings 512 of the rail 500 (shown in FIG. 5) engage with the pins 620-632 on the valve seat 604 (shown in FIG. 6) to mount the rail 200 to the valves 404, 408 (shown in FIG. 4). In particular, the rail 200 is positioned near the valve housings 404, 408 such that the first slot portion 520 of each of the openings 512 is generally aligned with the pins 620-632 on the valve housings 404, 408 (e.g., pins 628, 632 on valve 404 and pins 620, 625 on valve 408). The rail 200 is then pushed forward such that the pins 620-632 slide in the first slot portion 520. When the pins 620-632 engage the second slot portion 524, the rail 200 is lowered until the pins 620-632 contact the slot tip 528 of each opening 512. When the pins 620-632 are in contact with the slot tips 528 of the openings 512, the rail 200 is fully supported by the pins 620-632 and is securely mounted to the valve housings 404, 408, as shown in FIG. 7. Thus, the mounting configuration according to embodiments of the invention is much simpler to install and replace than the prior art mounting configurations.

It will be appreciated that the pins 620-632 are selected such that the pins as a whole can support at least the weight of the rail 200, and the weight of any transport mechanisms, carriers, disks, etc. supported by the rail 200. It will also be appreciated that fewer than four pins or more than four pins can be used to support the rail 200. For example, one pin may be provided on each side of the valve seat 604, each pin positioned at the same relative location. It will also be appreciated that the number of openings 512 on the rails 200 will correspond to the number of pins provided on the valve seat 604.

Figure 8:
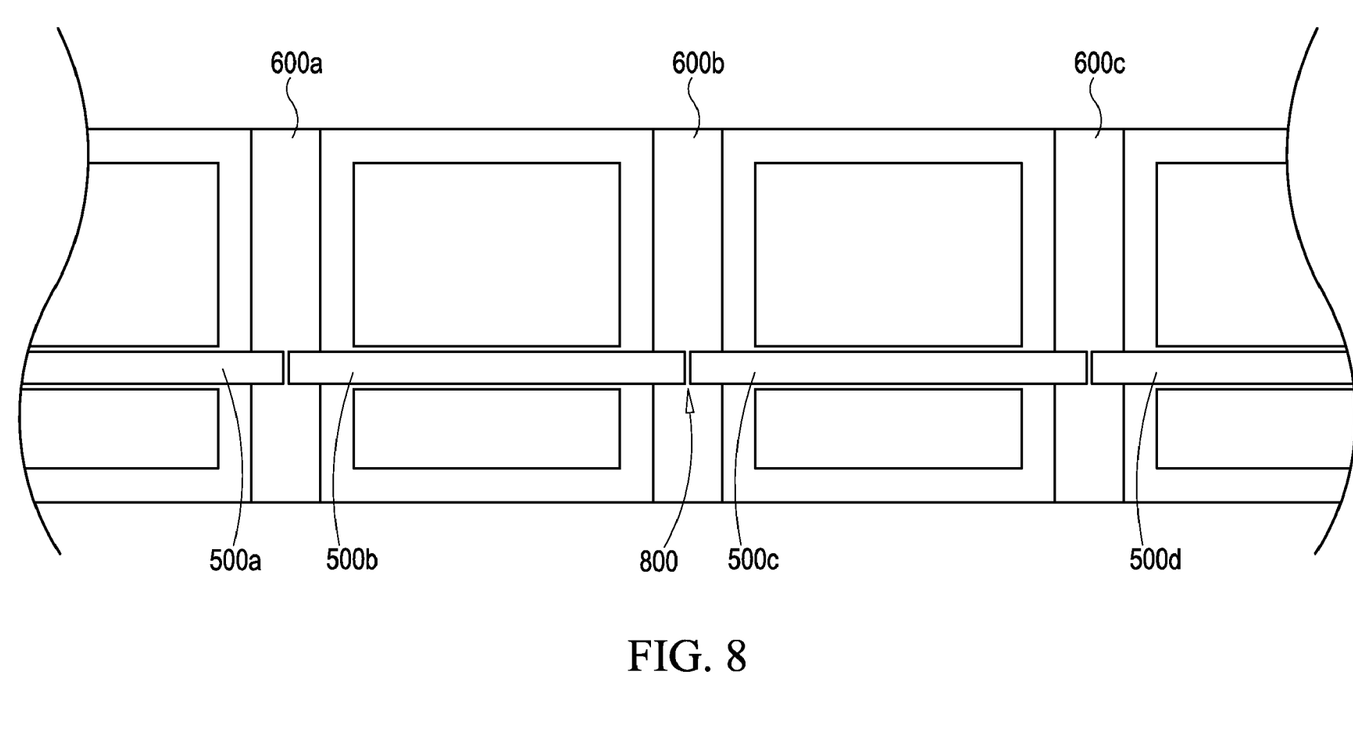
FIG. 8 is a perspective view illustrating alignment of multiple transport rails in accordance with one embodiment of the invention.

FIG. 8 illustrates the alignment of the rails 500 using the mounting configuration described above. Each rail 500a, 500b, 500c, 500d (collectively, 500) is mounted as described above to two of valves 600a, 600b, 600c (collectively, 600), and are suspend within the chamber. As shown in FIG. 8, the rails 500 are linearly aligned with one another because the pins 620-632 are positioned at the same location on each valve housing and any geometrical changes of the chamber body does not affect the alignment of the rails.

In addition, as shown in FIG. 8, a gap 800 may be provided between the rails 500. The gap 800 may allow for thermal expansion and/or space for the valve blade 618. A spring loaded plunger (not shown) may also be used to minimize movement of the rails resulting from carrier motion.

As can be understood from the above description and as illustrated in FIG. 8, an advantageous feature of the invention is that the rails are not mounted to the process chamber. Rather, at each end the rails are mounted to a valve housing and traverses the chamber in a suspended manner. This is advantageous especially for chambers that undergo high thermal loading and therefore are subject to thermal expansion and contraction.

Figure 9:
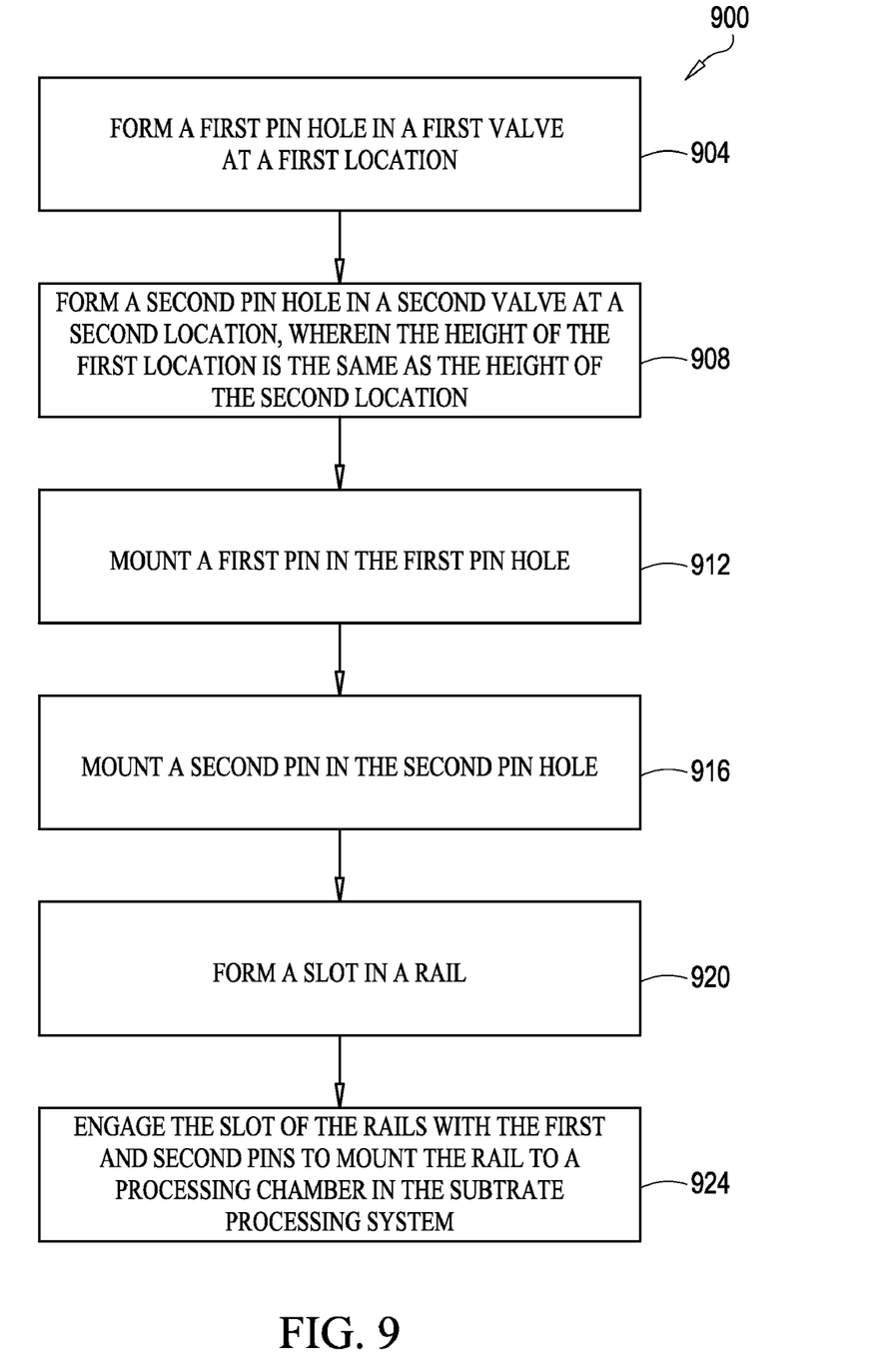
FIG. 9 is a flow diagram of a method of mounting a transport rail in accordance with one embodiment of the invention.

FIG. 9 illustrates a process for mounting a rail to a processing chamber 900. It will be appreciated that the process 900 described below is merely exemplary and may include a fewer or greater number of steps, and that the order of at least some of the steps may vary from that described below.

The process 900 begins by forming a first pin hole in a first valve at a first location (block 904) and forming a second pin hole in a second valve at a second location, the height of the first location and the height of the second location being the same (block 908). For example, the first pin hole and second pin hole may be machined in the valves.

The process 900 continues by mounting a first pin in the first pin hole (block 912), and mounting a second pin in the second pin hole (block 916). For example, the pins may be mechanically pressed into the holes in an interference fit arrangement.

It will be appreciated that the process 900 may include forming third and fourth pin holes in the first valve and second valve, respectively, in an arrangement as shown in FIGS. 6A-6B. The process 900 may also include mounting a third pin in the third pin hole and mounting a fourth pin in the fourth pin hole. The third pin and the fourth pin are located at the same height and are in line with the first and second pins, respectively (e.g., as shown in FIGS. 6A-6B). In such an arrangement, the first and third pins, and second and fourth pins, are in-line with one another.

The process 900 continues by forming a slot in the rail (block 920). For example, with reference to FIG. 5, the openings 512 may be formed in the rail 200.

The process 900 continues by engaging the slot of the rail with the first and second pins to mount the rail to a processing chamber in a substrate processing system (block 924). For example, as described above with reference to FIGS. 4-7, the rail is positioned near the valves such that the first slot portion of each of the openings is generally aligned with the pins on the valve seats. The rail is then pushed forward such that the pins slide in the first slot portion. When the pins engage the second slot portion, the rail is lowered until the pins contact the slot tip of each opening. When the pins are in contact with the slot tips of the openings, the rail is fully supported by the pins and is securely mounted to the valves.

The process 900 may continue by repeating the above process to mount additional rails to form the drive track 144. Because all of the pins are positioned at the same valves and all of the rails have the same configuration, the rails are automatically aligned, as shown in FIG. 8.

FIGS. 10-12C illustrate embodiments in which two valve housings are not available for mounting the transport rail 500. For example, typically, only one valve housing is available for mounting the transport rail 500 when the processing chamber is adjacent to the elevator (e.g., elevators 128, 131 of FIG. 1).

Figure 10:
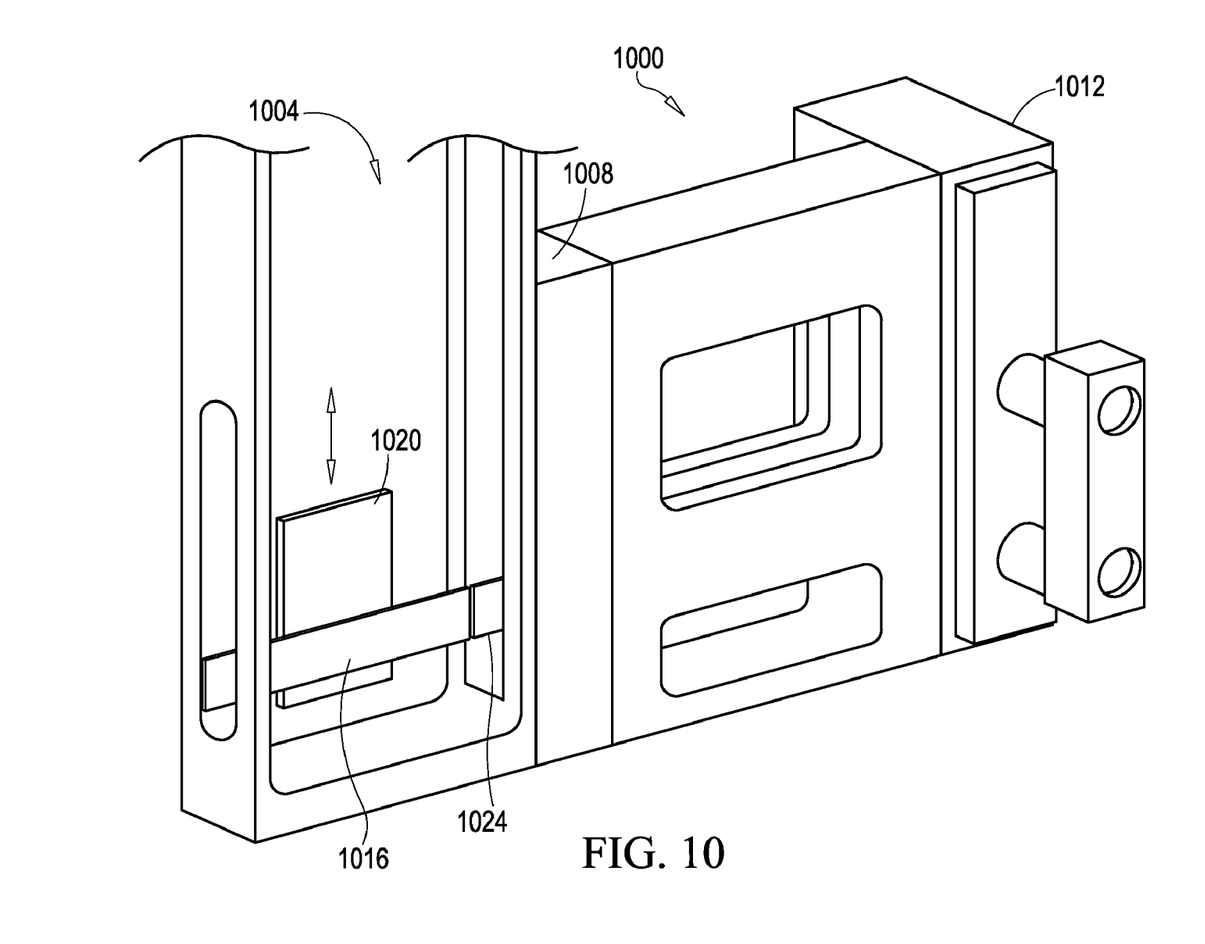
FIG. 10 is a perspective view of a process chamber, elevator and transport rail in accordance with one embodiment of the invention.

FIG. 10 illustrates such a processing chamber 1000 that is adjacent to an elevator 1004. An adapter 1008 is provided between the processing chamber 1000 and the elevator 1004. The transport rail 500 is provided and mounted as described above with reference to FIGS. 4-7 in the processing chamber 1000 to the adapter 1008 and the valve 1012. A transport rail 1016 is also provided in the elevator 1004. The transport rail 1016 is secured to the movable structure 1020 of the elevator 1004 by, for example, fastening (e.g., bolting) the transport rail 1016 to the movable structure 1020. The movable structure 1020 is configured to align the transport rail 1016 with the transport rail 500. In some embodiments, an extension bracket 1024 may need to be provided to mount the transport rail 500 to the coupler 1008.

Figure 11A:
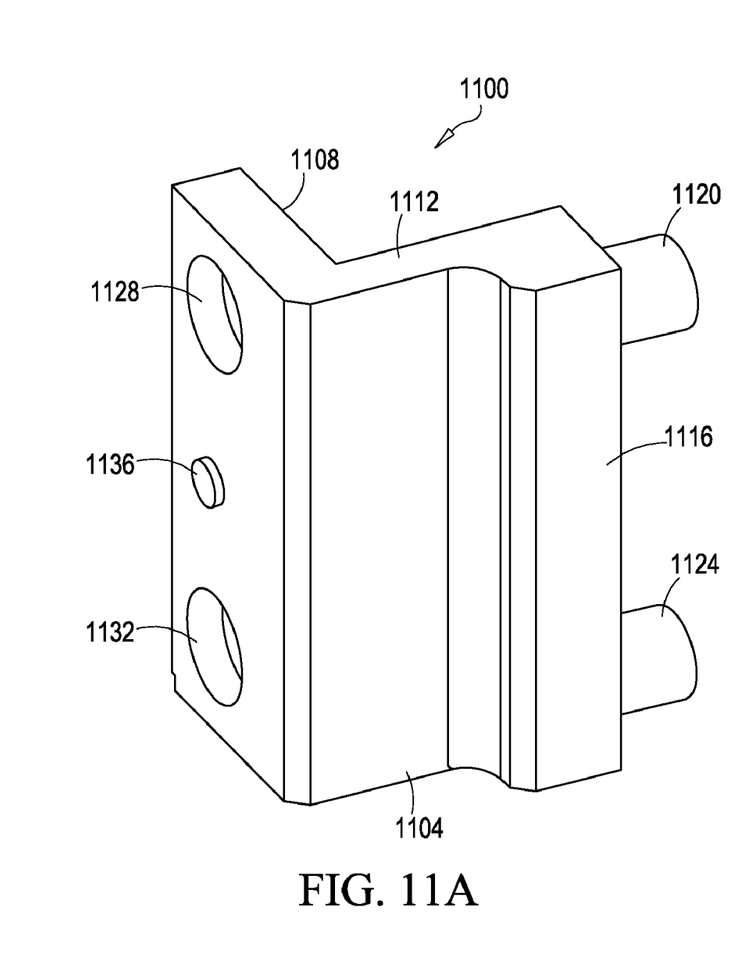
FIGS. 11A and 11B are perspective views of an extension bracket in accordance with one embodiment of the invention.
Figure 11B:
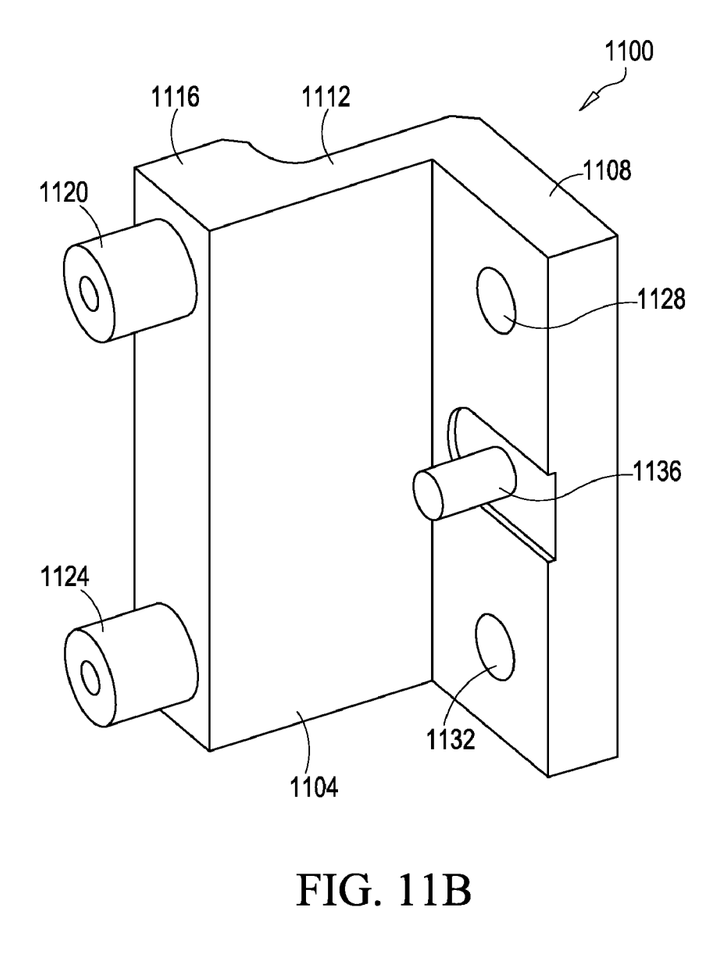

FIGS. 11A and 11B illustrate an exemplary extension bracket 1100 that can be used as the extension bracket 1024. The extension bracket 1100 includes a bracket body 1104 that includes a first body portion 1108, a second body portion 1112 and a third body portion 1116 that are integrally formed with one another. As shown in FIGS. 11A and 11B, the first and second body portions 1108, 1112 are substantially perpendicular to one another, and the second and third body portions 1112, 1116 are substantially perpendicular to one another. A first pin 1120 and second pin 1124 are connected to the third body portion 1116 and are configured to engage with the openings 520 on the end 512 of the transport rail. Openings 1128, 1132 are provided in the first body portion 1108 and are configured to receive bolts (or other fastening devices) to secure the first body portion 1108 to the adapter 1008. A pin 1136 may also be provided on the first body portion 1108 to properly align the first body portion 1108 within the adapter 1008.

Figure 12A:
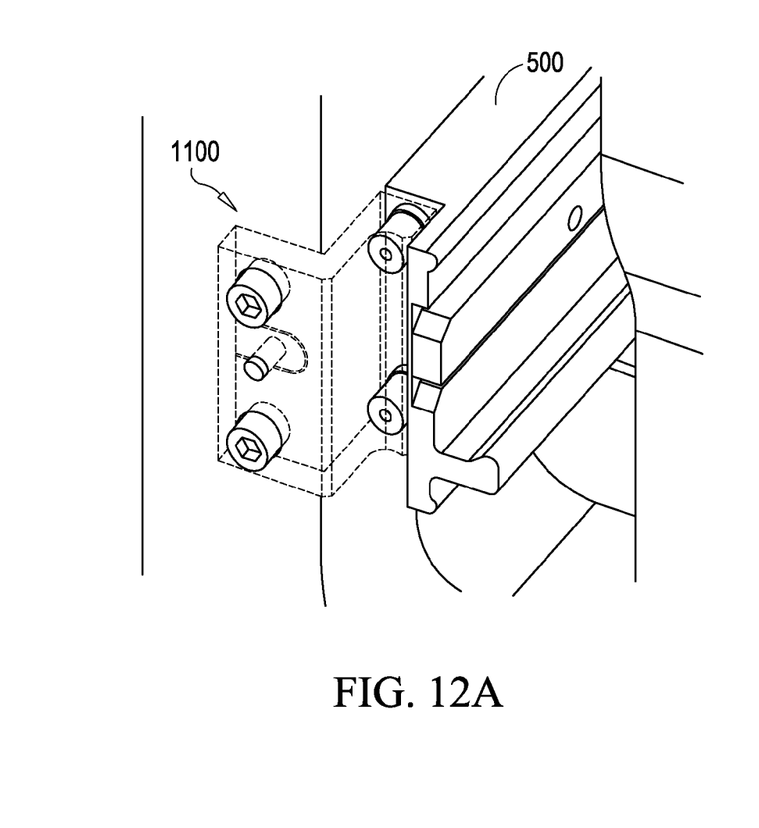
FIGS. 12A-C are perspective views of the extension bracket and transport rail in accordance with one embodiment of the invention.
Figure 12B:
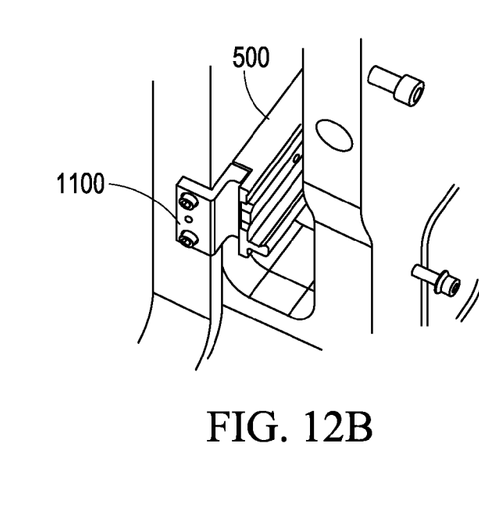
Figure 12C:
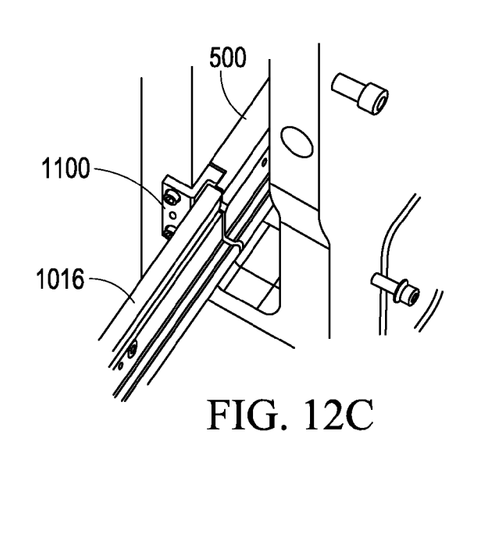

FIG. 12A illustrates engagement the pins 1120, 1124 with the openings 520 (obscured) of the end 512 of the transport rail 500, and engagement of the bolts 1200, 1204 through openings 1128, 1132 and pin 1136 with the adapter 1008. FIG. 12B illustrates the engagement of the bracket 1100 with the adapter 1008 and transport rail 500 in further detail. As shown in FIG. 12C, the transport rail 1016 can then be aligned with the transport rail 500, and is free to move up and down.

It will be appreciated that in some embodiments, it may be desirable to secure the transport rail 500 to the valves 404, 408 with one or more fastening devices to provide additional mounting support. For example, a bolt (or other fastening device(s)) may secure the transport rail 500 to the valve 404 and valve 408.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

The present invention has been described in relation to particular examples, which are intended in all respects to be illustrative rather than restrictive. Those skilled in the art will appreciate that many different combinations of will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A substrate processing system comprising: a processing chamber having a first side and a second opposing side; a first valve housing on the first side; a second valve housing on the second opposing side; a first pin connected to the first valve housing at a first location; a second pin connected to the second valve housing at a second location, the first location being horizontally aligned to the second location; and a rail having a slot corresponding to the first pin and the second pin, the slot engageable with the first pin and the second pin, wherein the rail is mounted to the first valve housing and the second valve housing.

2. The substrate processing system of claim 1, wherein the rail traverses the interior of the chamber in a suspended manner.

3. The substrate processing system of claim 1, wherein the slot comprises a first slot portion and a second slot portion connected to the first slot portion, the second slot portion having a slot tip, and wherein the slot tip contacts the first pin and the second pin when the rail is mounted to the processing chamber.

4. The substrate processing system of claim 1, wherein the rail comprises a first slot corresponding to the first pin and a second slot corresponding to the second pin, the first slot engageable with the first pin and the second slot engageable with the second pin.

5. The substrate processing system of claim 1, wherein the first valve housing includes a first location pin hole and the second valve housing includes a second location pin hole, the first pin insertable into the first location pin hole and the second pin insertable into the second location pin hole.

6. The substrate processing system of claim 1, further comprising:
a second processing chamber having a first side and a second opposing side;
a third valve housing on the second opposing side of the second processing chamber;
a third pin connected to the second valve housing at a third location;
a fourth pin connected to the third valve housing at a fourth location, the third location and the fourth location being linearly aligned with the first location and the second location; and
a second rail having a slot corresponding to third pin and fourth pin, the slot engageable with the third pin and the fourth pin to mount the second rail to the second valve housing and the third valve housing.

7. The substrate processing system of claim 6, wherein the first rail and the second rail are linearly aligned.

8. The substrate processing system of claim 6, wherein the first rail and the second rail are mounted such that a gap is provided between the first rail and the second rail.

9. The substrate processing system of claim 1, further comprising:
an elevator chamber having a first side and a second opposing side and a movable elevator structure;
a second rail mounted to the movable elevator structure;
a second processing chamber having a first side and a second opposing side;
an adapter housing between the elevator chamber and the second processing chamber;
a third pin connected to the second valve housing at a third location, the third location being horizontally aligned to the first location and the second location;

a third rail having a slot corresponding to third pin, the slot engageable with the third pin; and an extension bracket having a fourth pin, the extension bracket mounted to the adapter, the slot of the third rail engageable with the fourth pin to suspend the third rail within the second processing chamber.

10. A substrate processing system comprising: a plurality of processing chambers; a plurality of valves, each of the plurality valves separating one of the processing chambers from an adjacent one of the processing chambers, each of the plurality valves having a valve housing, and each valve housing having a first pin and a second pin symmetrically opposing the first pin; a plurality of rails, each rail mounted on the first pin on one of the plurality of valve housings and a second pin on another of the plurality of valve housings so as to be suspended within one of the processing chambers; and a transport mechanism movable on the plurality of rails to transport a substrate among the plurality of processing chambers.

11. The substrate processing system of claim 10, further comprising:

an elevator chamber having a movable elevator structure, the elevator chamber connected to two of the plurality of processing chambers;

a first adapter and a second adapter between each of the two processing chambers and the elevator chamber;

a transport rail mounted to the movable elevator structure; and first and second extension brackets to connect the transport rails of the two processing chambers to the first adapter and second adapter.

12. The substrate processing system of claim 10, wherein each of the rails comprises a slot engageable with the first pin of one value housing and the second pin of another valve housing.

13. The substrate processing system of claim 12, wherein the slot comprises a first slot portion and a second slot portion connected to the first slot portion, the second slot portion having a slot tip, and wherein the at least one slot comprises a first slot engageable with the first pin and a second slot engageable with the second pin.

14. The substrate processing system of claim 10, wherein the valve comprises a first locating pin hole and a second locating pin hole, the first pin insertable into the first locating pin hole and the second pin insertable into the second locating pin hole.

15. The substrate processing system of claim 10, wherein the plurality of rails are linearly aligned with one another to form a continuous linear rail.

16. The substrate processing system of claim 15, wherein the continuous linear rail comprises gaps between adjacent ones of the plurality of rails.

17. A substrate processing system comprising: a plurality of processing chambers; a plurality of valves, each of the plurality valves separating one of the processing chambers from an adjacent one of the processing chambers, each of the plurality valves having a valve housing, and each valve housing having a first mounting arrangement and a second mounting arrangement symmetrically opposing the first mounting arrangement; a plurality of rails, each rail mounted on the first mounting arrangement on one of the plurality of valve housings and a second mounting arrangement on another of the plurality of valve housings so as to be suspended within one of the processing chambers; and a transport mechanism movable on the plurality of rails to transport a substrate among the plurality of processing chambers.

* * * * *